United States Patent [19]

Wheeler et al.

[11] 4,376,482
[45] Mar. 15, 1983

[54] WAFER ORIENTATION SYSTEM

[75] Inventors: William R. Wheeler, Saratoga; George J. Kren, Los Altos; David D. Clementson, Palo ALto, all of Calif.

[73] Assignee: Tencor Instruments, Mountain View, Calif.

[21] Appl. No.: 265,412

[22] Filed: May 19, 1981

[51] Int. Cl.³ ............................................. B65G 47/24
[52] U.S. Cl. ..................................................... 198/394
[58] Field of Search ........................ 198/379, 394, 395; 406/87; 414/757

[56] References Cited

U.S. PATENT DOCUMENTS

| | | | |
|---|---|---|---|
| 3,297,134 | 1/1967 | Pastuszak | 414/757 X |
| 3,820,647 | 6/1974 | Waugh, Jr. et al. | 198/395 X |
| 3,972,424 | 8/1976 | Levy et al. | |
| 4,024,944 | 5/1977 | Adams et al. | 198/394 |
| 4,242,038 | 12/1980 | Santini et al. | 414/755 |

Primary Examiner—John J. Love
Assistant Examiner—Paul A. Sobel
Attorney, Agent, or Firm—Thomas Schneck

[57] ABSTRACT

A wafer orienting apparatus having inwardly biased rollers, spaced about the circumferential edge of a wafer in contact with the edge. Two of the rollers are spaced apart a distance less than the dimension of a primary flat registration edge and are mounted to follow the wafer edge upon rotation of the wafer. When a flat registration edge passes these closely spaced rollers they move inwardly, activating switches associated with a coincidence circuit. When both switches are simultaneously activated, the coincidence circuit produces a signal which stops wafer rotation, thereby orienting the wafer. The rollers are mounted so that they can be moved from the path of wafer travel after wafer orientation, permitting a queue of wafers to be oriented, one after the other.

9 Claims, 5 Drawing Figures

WAFER ORIENTATION SYSTEM

DESCRIPTION

1. Technical Field

The invention relates to handling apparatus for semiconductor wafers and the like and in particular to a system which rotates a wafer until a registration edge arrives at a desired position so that the wafer orientation is known.

In processing semiconductor wafers for manufacturing integrated circuits, it is often necessary to present the wafers to processing equipment with uniform alignment. However, when wafers are shipped, wafer carriers do not preserve alignment, mainly because it is not desirable to hold the wafers in a stiff position during shipment due to the risk of cracking or chipping. While prior devices are known for automatically unloading wafer carriers, most unloading devices do not automatically provide a desired wafer alignment.

2. Background Art

Previously, it has been known that a roller may be used to contact the round edge of a wafer having a flat registration edge. When the flat edge approaches the roller, the roller loses traction and wafer rotation stops. This indicates the position of the flat edge. However, a problem with this approach is that it is difficult to obtain the right amount of pressure against the wafer edge for accurate positioning of the wafer.

Another approach involves the use of optical transmitters and receivers, i.e., switches, placed near the edge of the wafer. When the wafer flat edge passes in the vicinity of the optical switch there is high light transmission between the transmitter and receiver. When the round portion of the wafer passes between the transmitter and receiver, there is less light and hence the position of the flat edge is known. However, certain wafers are transmissive to the wavelengths used in optical switches, while others are not. Optical switches are not satisfactory for use with wafers of unknown light transmissive qualities.

Still another approach involves a pneumatic rotational system as described in U.S. Pat. No. 4,242,038 to Santini, et al. This device uses a pair of registration blocks for determining wafer orientation.

An object of the invention was to devise a simple, highly accurate system for locating the flat edge of a semiconductor wafer or the like.

Disclosure of Invention

The above object has been achieved with a system which uses radially inwardly biased rollers, about the circumferential edge of a wafer to contact the wafer edge. At least two of the rollers are spaced apart a distance less than the dimension of a primary flat registration edge of the smallest size wafer to be measured. The wafer is caused to rotate. When the reference flat wafer edge passes the closely spaced rollers, they move radially outwardly due to force exerted against the wafer by the other rollers. Sensing means are provided to detect this significant radially outward displacement of the rollers so that wafer rotation can be stopped, thereby positioning the wafer with a known orientation.

The rollers may be mounted on a bed which is vertically movable, positioning rollers below a wafer conveyor until a wafer is in a position to be surrounded by the rollers. When this occurs, the rollers are elevated so that they contact the wafer edge, orient the wafer, then stop and lower their position, allowing the wafer to move on the conveyor. Moreover, for different size wafers, the position of the closely spaced rollers can be laterally moved prior to processing each different size wafer, so that the operation can be carried out to distinguish between the primary reference flat edge and the secondary reference flat edge.

BEST MODE FOR CARRYING OUT THE INVENTION

Figure 1:
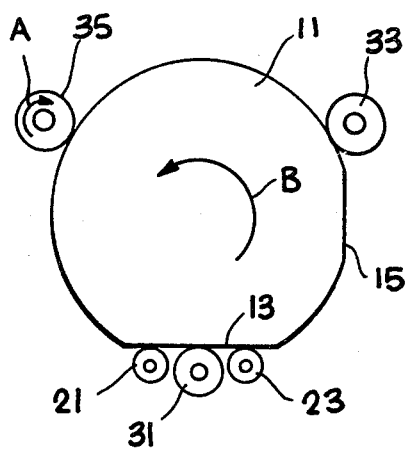
FIG. 1 is a simplified top plan view of a wafer processing system in accord with the present invention.

With reference to FIG. 1, a semiconductor wafer 11 is shown. The present invention is not restricted to semiconductor wafers, but may also be used with other similarly shaped articles having registration edges. The wafer 11 typically has a diameter of 3 inches, 100 mm. or 125 mm. The wafer 11 may be seen to have a primary flat edge 13 and a secondary flat edge 15, termed "secondary" because the lengthwise dimension of this edge is at least 20% less than the dimension of the primary flat edge.

In accord with the present invention, a first set of two rollers 21 and 23 is provided, spaced apart a distance less than the dimension of the primary flat registration edge 13, but more than the dimension of the secondary edge 15. The two rollers are radially inwardly biased toward the center of wafer 11, so that the rollers can follow the wafer edge, like cam followers. These movable rollers are mounted on posts connected to switch activating devices. Outward displacement of rollers 21 and 23 causes switch activation, explained below. Rollers 21 and 23 have a diameter of approximately one quarter inch.

A second set of rollers 31, 33 and 35 is spaced in the configuration defining a desired position for the wafer circumferential edge within the configuration of the rollers. Specifically, the rollers are positioned in corners of an equilateral polygon so that a generally circular wafer can rotate within the space defined by rollers positioned at these corners. One of the rollers, namely roller 35 in FIG. 1, is driven by a motor so that the roller rotates in the direction of the arrow A. This causes wafer rotation in the direction of arrow B, with rollers 33 and 35 rotating as idlers, tracking the circumferential edge of wafer 11. In the second set of rollers, roller 31 is fixed in position between rollers 21 and 23. Roller 31 is smaller in diameter than rollers 33 and 35. The former has a diameter of approximately ⅜ inch, while the latter have a diameter of approximately ¾ inch. Roller 35 has a compliant outer surface, preferably rubber of medium hardness for active purposes. Rollers 33 and 35 are movable, applying tension against wafer 11 in the direction of fixed roller 31. This tension forces the outward displacement of rollers 21 and 23 when a reference edge passes in front of these rollers. The entire wafer is translated toward rollers 21 and 23 by a slight amount. After the flat reference edge passes rollers 21 and 23 the wafer is translated back a slight amount because of force against the wafer edge by fixed roller 31.

Figure 1A:
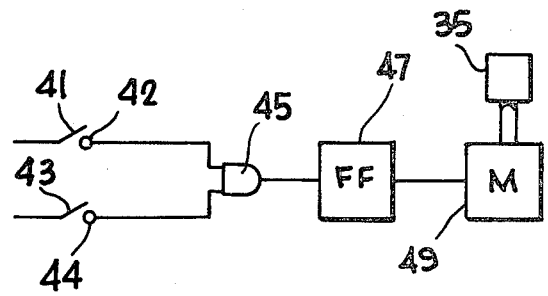
FIG. 1a is an electrical diagram of a coincidence detection circuit of the present invention.

It can be seen that wafer 11 will be slightly displaced toward roller 31 when the primary flat registration edge 13 is in the position shown. On the other hand, when the primary edge 13 is in a position other than the one shown in FIG. 1, rollers 33 and 35 will be displaced away from roller 31 a slight distance. When this occurs, the first set of rollers 21 and 23 will be displaced radially inwardly. When both of the rollers 21 and 23, comprising the first set of rollers, move radially inwardly, they carry switch activating members, represented in FIG. 1a by the switch arms 41 and 43. When these arms close the switches 42, 44 respectively, the AND gate 45 goes to a high state, setting flip-flop 47 in a latched condition. This signals motor 49 to cease rotation, thereby stopping the drive roller 35 which controls wafer rotation. Sensing of the primary flat registration surface and stopping of the wafer may be done so rapidly as to determine the rotational position of the wafer within a fraction of one degree.

Figure 2A:
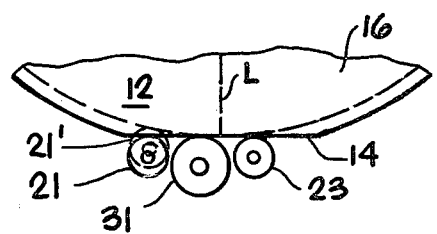
FIG. 2a is a plan view of a detail of the present invention showing lateral offset of a wafer edge sensing mechanism for distinguishing between primary and secondary registration edges.
Figure 2:
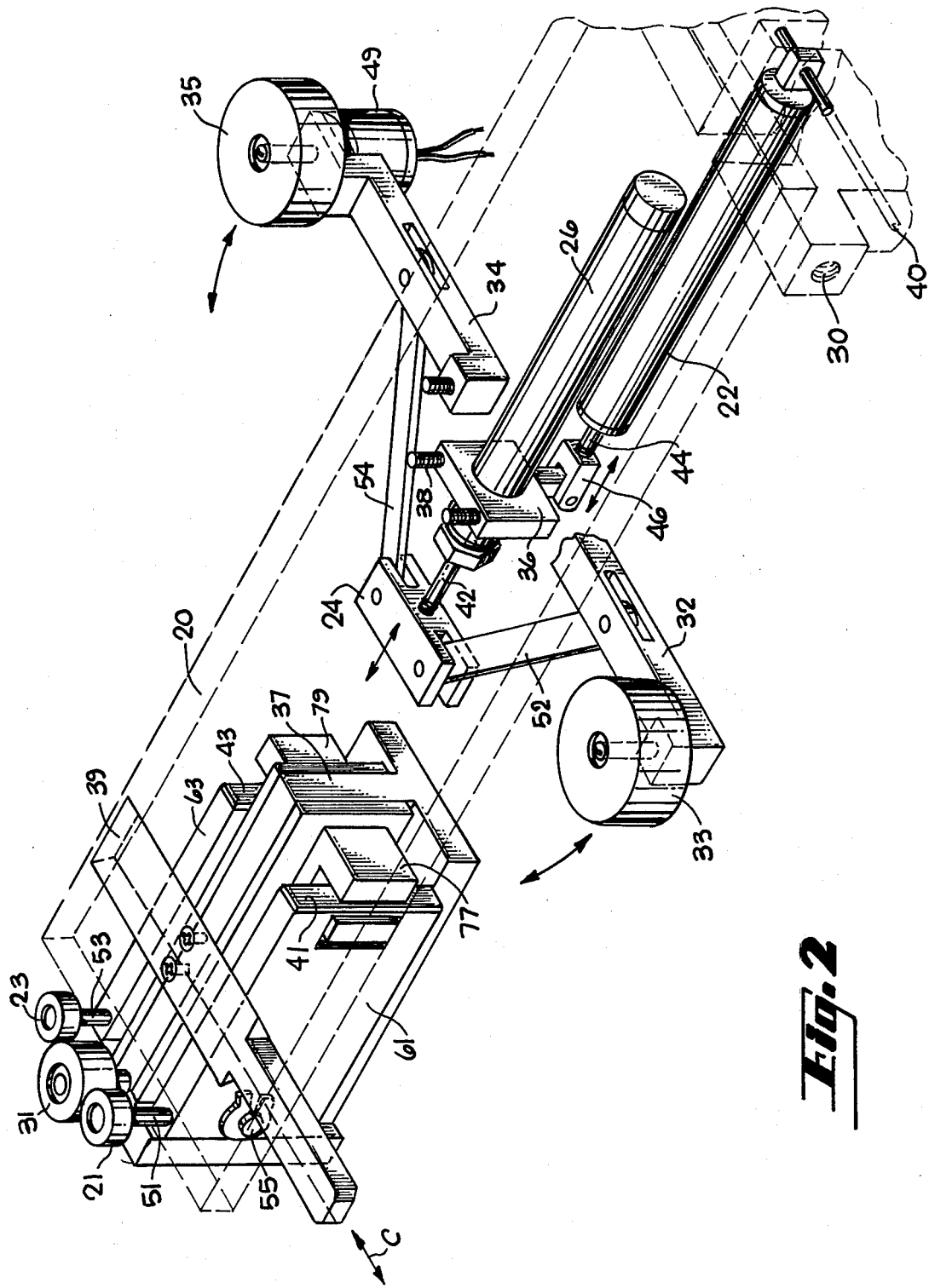
FIG. 2 is a perspective view of a first set of pivoting rollers spaced on opposite sides of a fixed roller.

Details of the mounting of the first set of rollers 21 and 23, as well as the fixed roller 31 may be seen in FIG. 2. Roller 21, as well as roller 23 are mounted on vertical posts 51 and 53, respectively. These posts are connected to lever arms 61 and 63, respectively which pivot about a pivot member 55, effectively causing the posts 51 and 53 to pivot about the same member, as the rollers 21 and 23 move radially inwardly and outwardly with respect to a wafer center. Such motion causes the ends of levers 61 and 63 to move up and down. Lever 61 carries a switch arm 41, while lever 63 carries a switch arm 43. These switch arms are opaque pieces of film, known as flags, having a thin transparent lateral stripe in the center thereof. For example, switch arm 41 has a transparent stripe which permits transmission of light therethrough. The width of the transmissive stripe is approximately 3 to 20 mils. The stripe passes between an optical switch 77 having a transmitter and receiver on opposite sides of the switch arm 41. When the roller 21 is biased inwardly, such as when the round portion of the wafer is contacting the roller, the switch is open since there is no communication between the transmitter and receiver. However, when the roller 21 is biased radially outwardly with respect to a wafer, such as when a flat registration edge is in contact with roller 31, the stripe allows the transmission of light from the transmitter to the receiver, thereby closing the switch, at least momentarily. When both rollers 21 and 23 pivot radially outwardly, both switches 42 and 44 in FIG. 1a close, causing AND gate 45 to transmit a signal to flip-flop 47, stopping wafer rotation as previously explained. The signal which stops wafer rotation could also be used to achieve other orientations, such as further rotation by a number of degrees or the like. Many prior art devices failed to provide a signal which indicates the desired wafer position.

One of the problems which occurs in handling wafers of different sizes is that for larger wafers, the dimension of a secondary registration edge approaches or exceeds the dimension of a primary registration edge for a smaller wafer. For example, the dimension of the secondary edge of a five-inch wafer will exceed the dimension of a primary edge of a three-inch wafer. In order to provide that only primary edges will be detected, the rollers 21, 23 and 31 are connected to a frame 37 which in turn is connected to a rail 39 movable laterally in the direction of arrow C. Rail 39 is parallel to the primary reference edge of a wafer when such edge is in contact with both members of the first set of rollers, 21 and 23. For large wafers, the first set of rollers is manually offset from the middle of the primary reference edge of the wafer by lateral movement of framework supporting the rollers. Such an offset may be to either side of the edge so long as both rollers 21 and 23 maintain contact with the wafer edge in a position signalling registration on a primary reference flat edge. This is illustrated in FIG. 2a wherein the rollers 21, 23 and 31 are seen to be to the left side of the center line L of the primary reference edge 14 of wafer 12. The proper offset will preclude a similar radially outward alignment of both rollers 21 and 23 for the secondary reference edge, but permits outward motion for a primary reference edge. The dashed line 16 indicates the area of the same wafer with the secondary reference edge in front of rollers 21 and 23. Note that one of the two movable rollers, 21, has moved inward to a position indicated by dashed line 21', while only one of the movable rollers, 23, is at an outward position. Also note that if rollers 21 and 23 had not been shifted to the left it would not be possible to distinguish between primary and secondary reference flat edges. In general, the spacing of rollers 21 and 23 as well as the lateral positioning of these rollers must always be such that it is possible to discriminate between primary and secondary reference edges for different size wafers. Rail 39 in FIG. 2 provides a means to adjust the lateral positioning relative to a primary flat registration edge prior to rotation of the wafer. This rail has a dovetail cross section and fits into a dovetail groove just below a wafer conveyor.

A first air cylinder 22 may be seen below the upper surface of support bed 20. Air cylinder 22, electrically activated on command, raises bed 20, which is pivoted by pivot member 30. Cylinder 22 has a plunger 44 which causes a pivoted fork 46 to raise bed 20 by pushing on block 36, fastened to the bed by screws 38. The rearward end of cylinder 22 is pivoted at aperture 40 so that the cylinder can swing in a slight vertical arc as the bed is raised and lowered. The bed fits between parallel bands of a dual band conveyor system of the tape illustrated in FIG. 3. Bed 20 supports rollers 21, 23 and 31, as well as the connected switches at the bed end opposite pivot member 30. A second air cylinder 26 drives the scissors-like arms 32, 34 which position rollers 33 and 35. Cylinder 26 is mounted on block 36 and moves with bed 20. Plunger 42 terminates in a movable pivot block 24, having connecting arms 52 and 54 communicating with pivoted roller support arms 32 and 34, all forming a scissors-like mechanism which moves rollers 33 and 35 toward and away from the conveyor.

Figure 3:
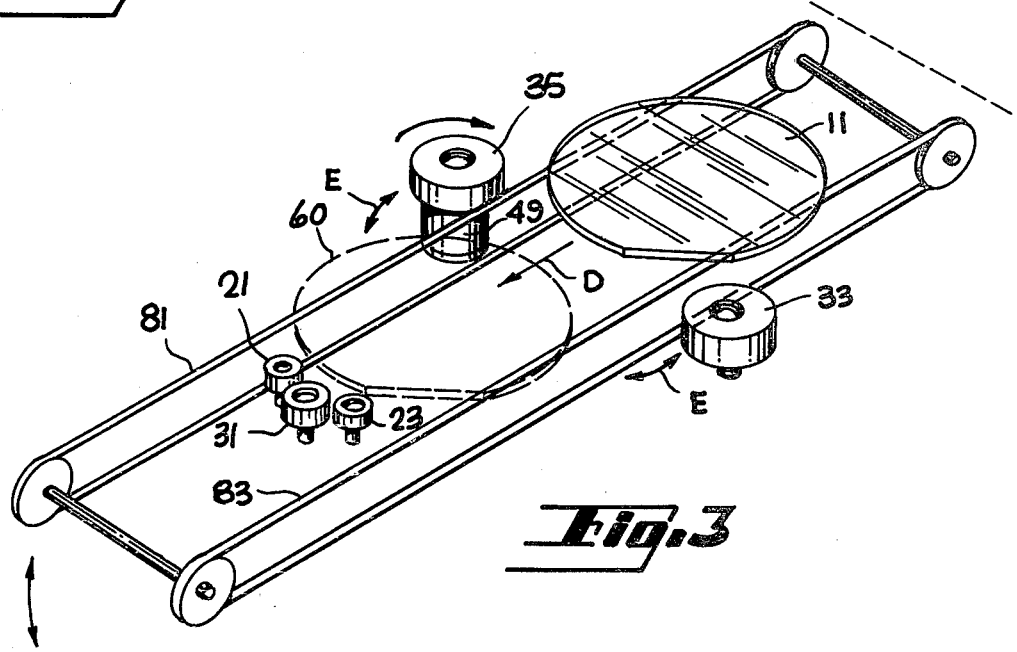
FIG. 3 is a plan view of an embodiment of the present invention employing a conveyor for wafer transport.

With reference to FIG. 3, as well as FIG. 2, a conveyor employing the wafer orienting system of the present invention may be seen. A wafer 11 is conveyed by dual belts 81 and 83 in the direction indicated by arrow D. Rollers 33 and 35 are mounted on upright posts which are connected together below the conveyor by the scissors-like mechanism shown and described with reference to FIG. 2. After passing above the rollers the wafer arrives in the position indicated by dashed line 60 where it is detected by a photodetector, not shown. The scissors-like mechanism is activated by air cylinder 26 driven by a signal from the photodetector, causing rollers 33 and 35 to nudge the wafer toward roller 31.

Slightly prior to activation of the scissors-like mechanism, the photodetector communicates with air cylinder 22, raising the bed supporting the first set of rollers 21 and 23 as well as roller 31. In the raised or upper position the rollers are at an elevation for contacting a wafer edge. In the raised position, a pair of spacers, not shown, lifts the wafer off its conveyor for rotation. In the lower position the rollers were at an elevation below the wafer path for allowing the wafer to pass on the conveyor.

After wafer 11 is nudged forward into contact with roller 31 by rollers 33 and 35, the roller 33 is driven by a motor 49 until rollers 21 and 23 both move radially outwardly a significant distance which is equal to the difference between the circumferential position of the rollers while tracking the round portion of the wafer edge and the position of the rollers while tracking a reference flat edge. The second air cylinder 26 activates the scissors mechanism pushing rollers 33 and 35 away from the conveyor, preparing for the next wafer. After the first set of rollers has signalled a primary registration edge, the apparatus is reset by moving the bed supporting all rollers to the lower position with air cylinder 22.

We claim:

1. Apparatus for orienting a wafer or the like having a primary flat registration edge along the wafer circumference comprising,
    a plurality of rollers spaced about the circumferential edge of a wafer and in friction contact therewith, with a first and second of said rollers spaced apart a distance less than the dimension of a primary flat registration edge, said first and second rollers inwardly biased against the wafer edge, and a third roller, powered by a motor, causing wafer rotation,
    means for sensing significant radial displacement of the first and second rollers upon rotation of the wafer, said displacement indicating contact with a flat registration edge, and
    means for stopping wafer rotation upon sensing of significant radial displacement of the first and second rollers, thereby orienting a wafer with the registration edge in contact with the first and second rollers.

2. Apparatus for determining orientation of a wafer or the like, having a primary flat registration edge, along the wafer circumference, comprising:
    means for supporting a wafer,
    a first set of two rollers spaced apart at a distance less than the dimension of a primary flat registration edge, said two rollers radially inwardly biased against the wafer edge,
    a second set of rollers inwardly biased in a configuration defining circumferential contacts for a wafer circumferential edge within the configuration with said rollers in friction contact with the wafer edge,
    means for rotating the wafer within the configuration of the second set of rollers, and
    means for signalling coincident radial displacement in the same direction of the first set of rollers upon rotation of the wafer, said displacement of the first set of rollers indicating contact with a flat registration edge.

3. Apparatus for determining orientation of a wafer or the like, having a major flat registration edge along the wafer circumference comprising:
    a dual band conveyor for transporting wafers,
    a vertically movable bed supporting a first set of two rollers at changeable elevations above and below said conveyor, said two rollers spaced apart at a distance less than the dimension of a major flat registration edge, said two rollers radially inwardly biased against the wafer edge,
    a second set of rollers mounted for positioning at changeable elevations above and below said conveyor, said second set of rollers spaced in a configuration at the upper elevation defining a desired position for a wafer circumferential edge within the configuration with said rollers in friction contact with the wafer edge,
    means for rotating the wafer within the configuration of the second set of rollers at the upper elevation, and
    means for signalling coincident radially outward displacement of the first set of rollers upon rotation of the wafer, said outward displacement of the first set of rollers indicating contact with a flat registration edge.

4. The apparatus of claim 2 or 3 further defined by a means for changing the position of the first set of rollers along a wafer edge whereby a primary reference edge may be distinguished from a secondary reference edge for various size wafers.

5. The apparatus of claim 2 or 3 wherein said first set of rollers are mounted on pivoting upright posts having switch activating means connected thereto.

6. The apparatus of claim 2 or 3 wherein said means for signalling coincident radial inward displacement of said first set of rollers comprises a pair of switches operated by said switch activating means connected to said pivoting upright posts.

7. The apparatus of claim 6 further defined by a coincidence detection circuit connected to said pair of switches for detecting simultaneous pivoting of said upright posts.

8. The apparatus of claim 7 further including circuit means connected to the coincidence detection circuit for stopping wafer rotation upon detection of simultaneous pivoting of the upright posts thereby orienting said wafers in a known position.

9. The apparatus of claim 2 or 3 wherein said second set of rollers comprises a drive roller, powered by a motor, and idler rollers.

* * * * *